(12) United States Patent
Loyd

(10) Patent No.: US 9,064,402 B2
(45) Date of Patent: Jun. 23, 2015

(54) ELECTRICAL FAULT DETECTION DEVICE FOR A WATERBORNE STRUCTURE AND METHOD THEREFOR

(71) Applicant: Matthew L. Loyd, Wentzville, MO (US)

(72) Inventor: Matthew L. Loyd, Wentzville, MO (US)

( * ) Notice: Subject to any disclaimer, the term of this patent is extended or adjusted under 35 U.S.C. 154(b) by 87 days.

(21) Appl. No.: 14/043,797

(22) Filed: Oct. 1, 2013

(65) Prior Publication Data

US 2015/0091732 A1  Apr. 2, 2015

(51) Int. Cl.
*G08B 21/00* (2006.01)
*G08B 21/18* (2006.01)

(52) U.S. Cl.
CPC .................................... *G08B 21/185* (2013.01)

(58) Field of Classification Search
CPC ................ G01R 19/15; G01R 19/145; G01R 19/16571; G01R 19/16576; G01R 31/08; G01R 31/343; G01R 31/3275; G01R 31/025; G08B 21/00; G08B 21/02; H02H 3/04; H02H 3/042; H02H 3/16; B60M 5/00
USPC ........... 340/635, 644, 650, 657, 664, 636.12, 340/636.13, 573.6, 384.1; 204/194, 196; 205/291, 726; 307/95, 96; 324/503, 324/556
See application file for complete search history.

(56) References Cited

U.S. PATENT DOCUMENTS

| | | | | | |
|---|---|---|---|---|---|
| 5,627,414 | A | * | 5/1997 | Brown et al. | 205/726 |
| 5,748,008 | A | * | 5/1998 | Landreth | 324/503 |
| 6,724,589 | B1 | * | 4/2004 | Funderburk | 361/42 |

* cited by examiner

*Primary Examiner* — Hung T Nguyen
(74) *Attorney, Agent, or Firm* — Andrew B. Whitehead

(57) ABSTRACT

A device for indicating the presence of an electrical fault for a waterborne structure includes a current tap electrically coupleable to an electrically conductive frame member of the waterborne structure and a grounding member configured for placement in water adjacent to the waterborne structure. An indicator is electrically coupled to the current tap so that an electrical charge supplied to the conductive frame member may be transmitted through the current tap and to the indicator. The indicator is electrically coupled to the grounding member to form a circuit.

20 Claims, 3 Drawing Sheets

US 9,064,402 B2

ELECTRICAL FAULT DETECTION DEVICE FOR A WATERBORNE STRUCTURE AND METHOD THEREFOR

FIELD

This disclosure relates generally to electrical fault detection devices, safety devices and methods for a waterborne structure supplied with an electrical power source.

BACKGROUND

Many waterborne structures, such as boat docks, are supplied with electricity for powering lighting circuits, boat lifts and general purpose receptacles. In many instances, the boat docks are fabricated from a metal frame, which is a good conductor of electricity. It has become increasingly common that a wiring fault, or electrical fault, may expose the users of the boat dock, and those in the water near the boat dock to substantial risk of death or injury by electrical shock. In some instances, electrically powered conductors come in contact with the metal frame of the boat dock, which charges the structure, and when a person touches the frame or the water surrounding the boat dock, the person is electrocuted and may drown. This is known as electric shock drowning (or ESD).

ESD is a significant risk because as boat docks age, it may be more likely that wiring faults will occur, and go undetected until a person is shocked or otherwise injured by the electrical fault. In some instances, the electrical fault may trigger a fire or other risk factor at or near the site of the electrical fault.

Accordingly, a need exists for a warning device to alert people to a potentially hazardous electrical condition at or near the boat dock.

BRIEF DESCRIPTION OF THE DISCLOSURE

In one aspect, a device for indicating the presence of an electrical fault for a waterborne structure includes a current tap electrically coupleable to an electrically conductive frame member of the waterborne structure and a grounding member configured for placement in water adjacent to the waterborne structure. An indicator is electrically coupled to the current tap so that an electrical charge supplied to the conductive frame member may be transmitted through the current tap and to the indicator. The indicator is electrically coupled to the grounding member to form a circuit.

In another aspect, a method of indicating the presence of an electrical fault on a waterborne structure includes coupling a current tap to a frame of the waterborne structure, the frame being electrically conductive and placing a grounding member in water adjacent to the waterborne structure. An indicator electrically coupled to the current tap is provided such that an electrical charge supplied to the conductive frame member is transmitted through the current tap and to the indicator. The indicator is electrically coupled to the grounding member to form a circuit.

In yet another aspect, a safety device for a boat dock includes an alarm device configured provide an alert to a person upon being triggered by an electrical fault of the boat dock. A triggering device is configured to trigger the alarm device. The triggering device includes a current tap electrically coupleable to an electrically conductive frame member of the boat dock and a grounding member configured for placement in water adjacent to the boat dock and a detector configured to detect the presence of an electrical current flowing between the current tap and the grounding member. The detector is configured to send a triggering signal to the alarm device upon detection of the current.

BRIEF DESCRIPTION OF THE DRAWINGS

FIG. 1 is a perspective view of an exemplary waterborne structure of an embodiment.

FIG. 2 is a side profile of the waterborne structure of FIG. 1.

FIG. 3 is a schematic diagram of a safety device according to an embodiment of the disclosure.

DETAILED DESCRIPTION OF THE DISCLOSURE

Embodiments of the disclosure are now described with reference to FIGS. 1-3. As used herein, like reference numbers amongst the Figs. Represent like structures, unless otherwise indicated.

Figure 1:
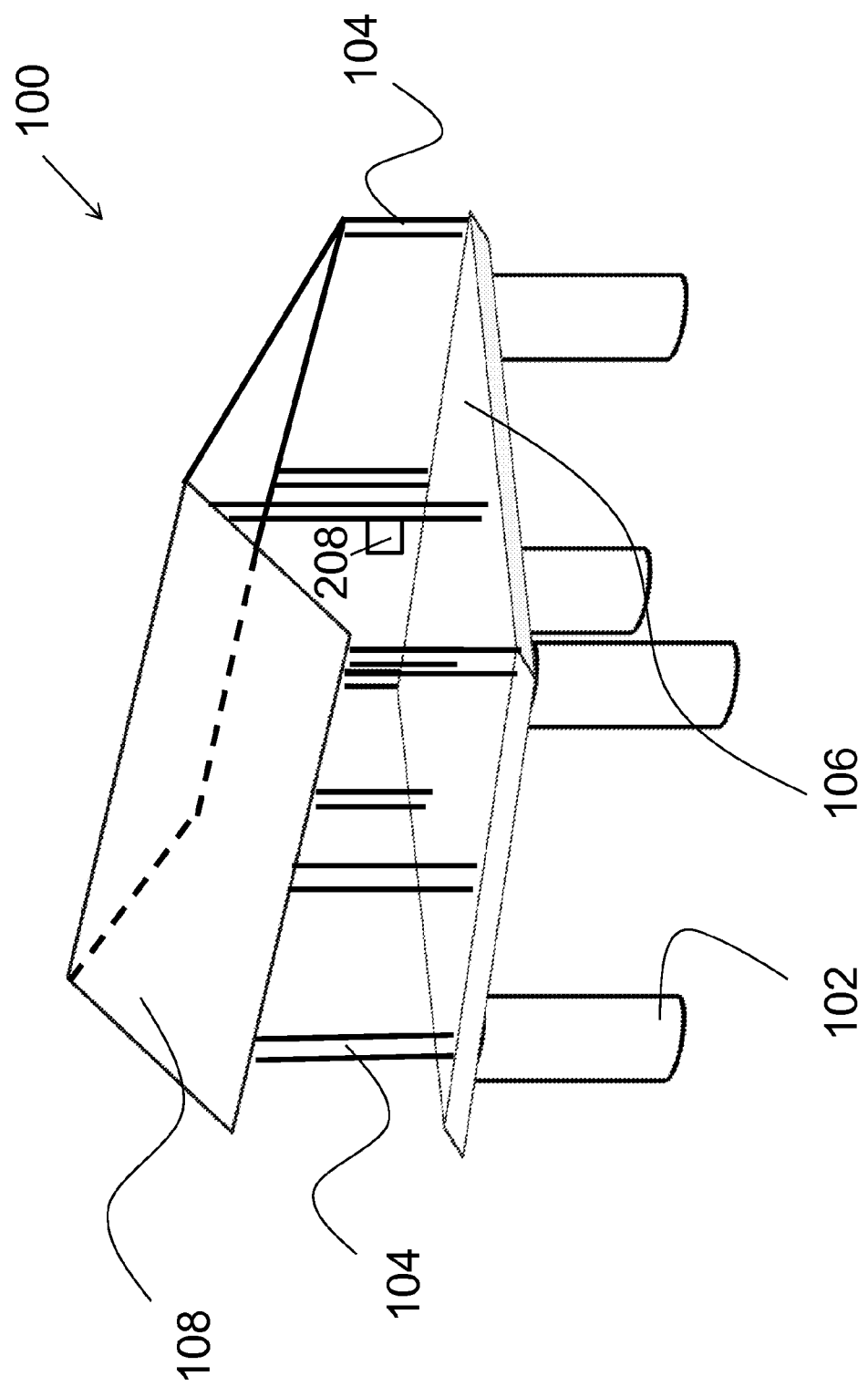
FIGS. 1-3 show example embodiments of the methods and systems described herein.
Figure 2:
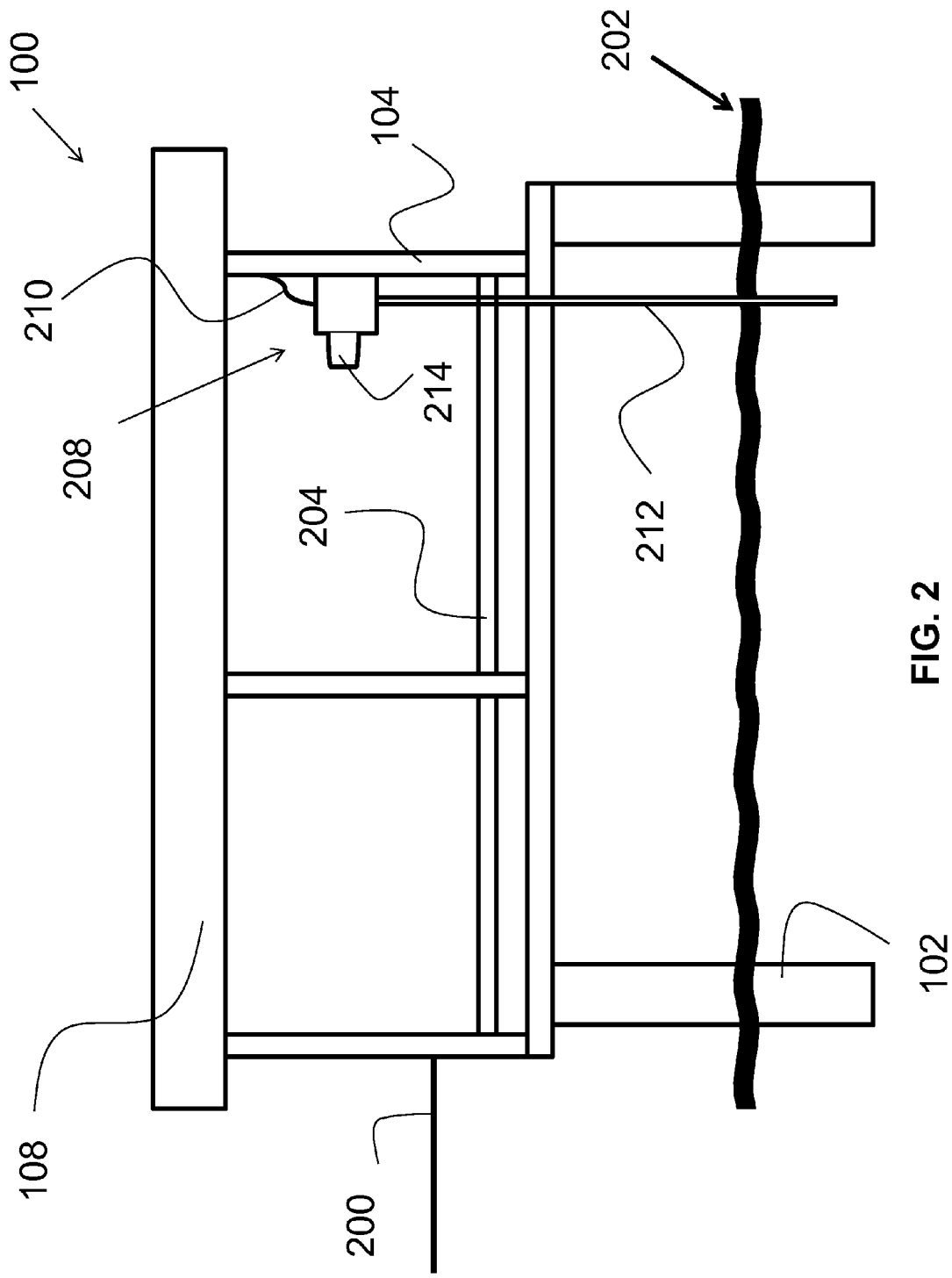

As illustrated in FIGS. 1-2, a waterborne structure (e.g., a boat dock) is shown. The waterborne structure may be supported by piers 102, which may be anchored to the ground under waterline 202 (shown in FIG. 2). In other embodiments, piers 102 may be flotation devices that provide buoyancy for the waterborne structure 100. The waterborne structure may be formed from frame members 104 that are coupled to a dock surface 106 at one end thereof, and to a roof structure 108 at another end thereof. The frame members 104 may be coupled to one another via other frame members 204, as shown in FIG. 2. For example, the frame members 104 may be steel, such as galvanized steel, or other metals or metal alloys. The frame members 104 are electrically conductive. In some embodiments, the frame members 104 may be coated with an electrically insulative coating, paint, powdercoat or the like. Frame members 204 are substantially similar in material and function to frame members 104. Each of the frame members 104, 204 are generally provided to give the waterborne structure its structural integrity, as is generally known in the construction of boat docks and other waterborne structures.

The waterborne structure 100 is supplied with electricity via a feed line 200. In one embodiment, the feed line 200 supplies 120V alternating (AC) current at 60 Hz to the waterborne structure 100. In other embodiments, the feed line may supply other rated values of alternating current, such as 220 V or the like. The feed line 200 may be connected to one or more electrical receptacles, lighting fixtures or other electrical outlets (not shown) via one or more circuits (not shown).

A safety device 208 for indicating the presence of an electrical fault is illustrated in FIG. 2. The safety device 208 includes a current tap 210 electrically coupleable to an electrically conductive frame member 104 of the waterborne structure 100. In one embodiment, the current tap 210 is an electrically conductive member, such as a copper wire, metallic coupler or the like. The end of the current tap 210 coupleable to the frame member 104 may be fitted with a coupling device for secure attachment to the frame member, or may be soldered or welded thereto. A grounding member 212 is configured for placement in water (illustrated as below waterline 202) adjacent to the waterborne structure 100. An indicator 214 is electrically coupled to the current tap 210 such if an electrical charge (such as due to a fault as described later herein) supplied to the conductive frame member is transmitted through the current tap and to the indicator 214 it will be activated. In some embodiments, the indicator 214 includes one or more of a visual and audio indicator, such as a light and buzzer, or the like. The indicator 214 is electrically coupled to the grounding member to form a circuit, as illustrated in FIG. 3, for example.

Figure 3:
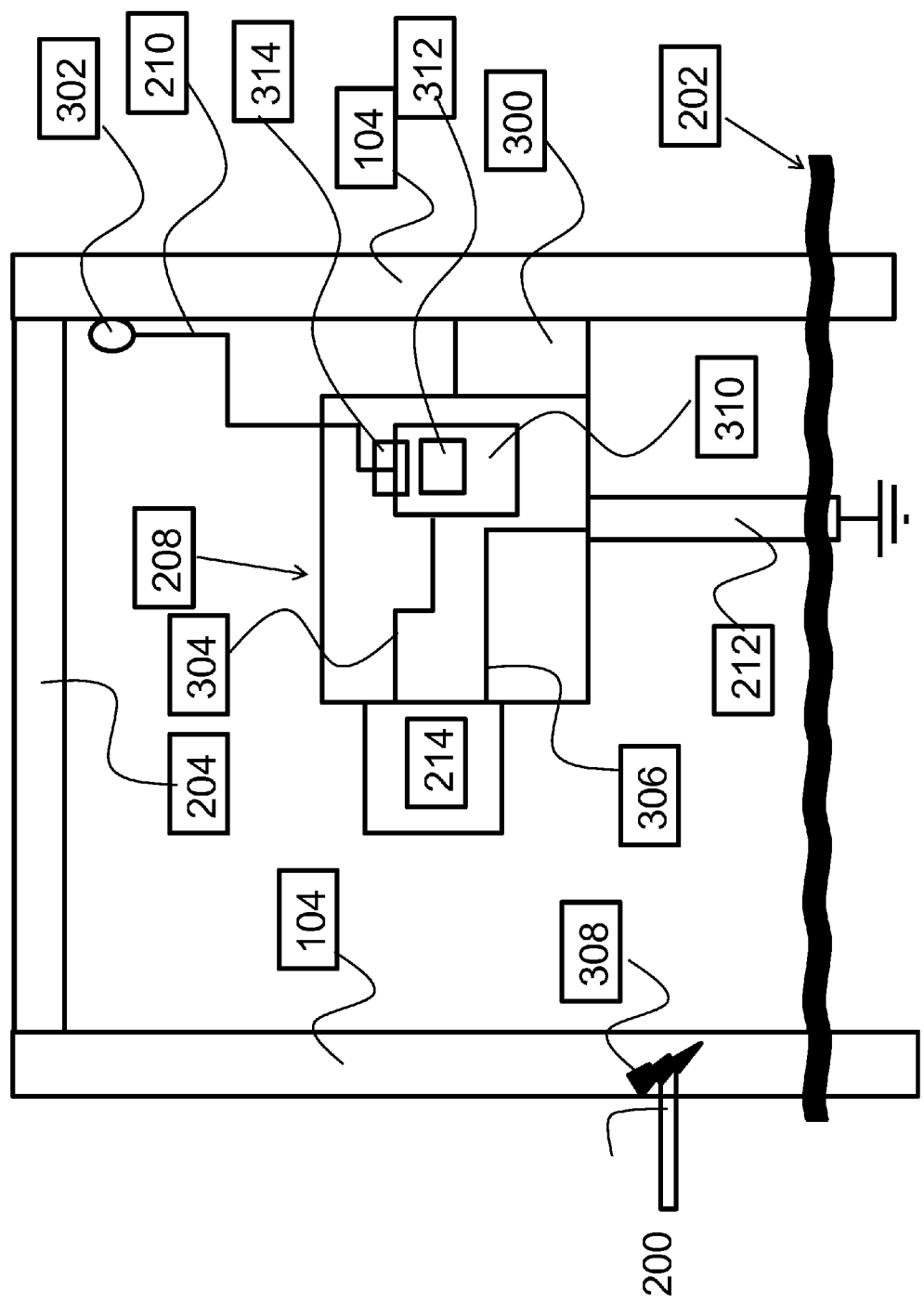

As illustrated in FIG. 3, the safety device 208 is rigidly secured to the frame member 104 by a coupling member 300. The coupling member may be a bracket, screw, bolt, weld, adhesive or other coupler capable of rigidly securing the safety device 208 to the frame member 104. The current tap 210 is also secured to the frame member 104 by way of a fastener 302, such that the current tap is in electrical contact with the frame member 104. For instance, the fastener 302 may be a screw, solder, bolt or other means of securing the current tap 210 to the frame member 104 that maintains electrical conductivity between the current tap 210 and the frame member 104. The current tap 210 is also in electrical communication with the indicator 214, by way of a wire conductor 304 or the like. Additionally, the grounding member 212 is in electrical communication with the indicator 214, for example by way of wire conductor 306, thus forming a complete circuit.

In use, the safety device 208 may sit idle, with the indicator 214 unpowered (i.e., in a deactivated state). However, when supply line 200 has a fault 308 such that an electrical charge is supplied from the supply line 200 to the conductive frame member 104, the safety device 208 may be activated as described herein. For example, a fault 308 may occur if an insulator of the supply line 200 becomes degraded, and allows a conductive wire to contact the bare metal of frame member 104. Accordingly, an electrical charge is transmitted from the supply line 200 to the frame member 104 and to the current tap 210 (which is in electrical communication with the frame member 104. The electrical charge thus is transmitted to the indicator 214, and is activated, as the indicator is also grounded by way of grounding member 212. As such, activation of the indicator 214 (e.g., a light, buzzer or the like) will alert a person that the frame member 104 of the waterborne structure is electrically charged (i.e., "hot") and may pose a dangerous condition. In instances where the frame members 104 are in electrical communication with the water surrounding the waterborne structure 100, the indicator 214 will also alert a person that the water surrounding the waterborne structure may also pose an electrical hazard. Accordingly, as in the exemplary embodiment described above, the safety device uses no electricity when idle, and is only activated if an electrical charge is supplied via the fault 308. Thus, the safety device 208 may be inexpensive to operate.

In another embodiment, the safety device 208 may include an auxiliary communications device 310. The auxiliary communications device 310 may be one or more of a wi-fi device, a cellular device, a radio frequency device, a telephonic device and a Bluetooth device, or the like. The auxiliary communications device 310 may be configured to be powered via current tap 210 or via a secondary power circuit 312. If the auxiliary communications device 210 is powered by the current tap 210, the auxiliary communications device 210 may remain unpowered (i.e., idle) until activation by the fault 308, in a manner similar to that of indicator 214. When activated, the auxiliary communications device 310 is configured to send an alert signal to a remote device (not pictured), such as a mobile device, computer, cell phone, pda, smartphone, or the like. The alert may display a message indicating that there is an electrical fault on the waterborne structure 100 or the surrounding water, and thus may pose an electrical safety hazard. In the instance wherein the auxiliary communications device is powered by the secondary power circuit 312, which may be a battery, solar power, A/C power source, DC power source, renewable energy source or the like, the auxiliary communications device 310 may be in an activated state and configured with a detection device 314 to monitor the current tap 210 for an electrical charge. If the detection device 314 (e.g., an A/C clamp meter or the like) detects an electrical charge in current tap 210, the auxiliary communications device is configured to send an alert to the remote device, as described herein.

In another embodiment, the safety device may also be configured "in reverse" such that if the electrical fault 308 is present in a location to electrical charge the water surrounding the waterborne structure 100, the electrical charge may then be transmitted via grounding member 212 (acting as the current tap) and then through current tap 210 (acting as the grounding member).

The safety device 208 may include one or more computer processors (not shown) for logic control of the indicator 214 and/or the auxiliary communications device 310. Accordingly, the methods and systems described herein may be implemented using computer programming or engineering techniques including computer software, firmware, hardware or any combination or subset thereof. The term processor, as used herein, refers to central processing units, microprocessors, microcontrollers, reduced instruction set circuits (RISC), application specific integrated circuits (ASIC), logic circuits, and any other circuit or processor capable of executing the functions described herein.

The systems and processes are not limited to the specific embodiments described herein. In addition, components of each system and each process can be practiced independent and separate from other components and processes described herein. Each component and process can also be used in combination with other assembly packages and processes.

As used herein, an element or step recited in the singular and proceeded with the word "a" or "an" should be understood as not excluding plural elements or steps, unless such exclusion is explicitly recited. Furthermore, references to "example embodiment" or "one embodiment" of the present disclosure are not intended to be interpreted as excluding the existence of additional embodiments that also incorporate the recited features.

As will be appreciated based on the foregoing specification, the above-discussed embodiments of the disclosure may be implemented using computer programming or engineering techniques including computer software, firmware, hardware or any combination or subset thereof. Any such resulting computer program, having computer-readable and/or computer-executable instructions, may be embodied or provided within one or more computer-readable media, thereby making a computer program product, i.e., an article of manufacture, according to the discussed embodiments of the disclosure. These computer programs (also known as programs, software, software applications or code) include machine instructions for a programmable processor, and can be implemented in a high-level procedural and/or object-oriented programming language, and/or in assembly/machine language. As used herein, the terms "machine-readable medium," "computer-readable medium," and "computer-readable media" refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The "machine-readable medium," "computer-readable medium," and "computer-readable media," however, do not include transitory signals (i.e., they are "non-transitory"). The term "machine-readable signal" refers to any signal used to provide machine instructions and/or data to a programmable processor.

This written description uses examples, including the best mode, to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A device for indicating the presence of an electrical fault for a waterborne structure, comprising:
 a current tap electrically coupleable to an electrically conductive frame member of the waterborne structure;
 a grounding member configured for placement in water adjacent to the waterborne structure;
 an indicator electrically coupled to the current tap such that an electrical charge supplied to the conductive frame member is transmitted through the current tap and to the indicator, wherein the indicator is electrically coupled to the grounding member to form a circuit.

2. The device according to claim 1, wherein the indicator comprises at least one of a visual and audio alert.

3. The device according to claim 1, wherein the indicator includes a light and a buzzer.

4. The device according to claim, wherein the indicator comprises a mounting member configured to be rigidly secured to the waterborne structure.

5. The device according to claim 1, wherein the indicator comprises an auxiliary communications device.

6. The device according to claim 5, further comprising a secondary power circuit for powering the auxiliary communications device.

7. The device according to claim 5, wherein the auxiliary communications device comprises at least one of a wi-fi device, a cellular device, a radio frequency device, a telephonic device and a Bluetooth device.

8. A method of indicating the presence of an electrical fault on a waterborne structure, comprising:
 coupling a current tap to a frame of the waterborne structure, the frame being electrically conductive;
 placing a grounding member in water adjacent to the waterborne structure;
 providing an indicator electrically coupled to the current tap such that an electrical charge supplied to the conductive frame member is transmitted through the current tap and to the indicator, wherein the indicator is electrically coupled to the grounding member to form a circuit.

9. The method according to claim 8, wherein the indicator comprises at least one of a visual and audio alert.

10. The method according to claim 8, wherein the indicator includes a light and a buzzer.

11. The method according to claim 8, wherein the indicator comprises a mounting member configured to be rigidly secured to the waterborne structure.

12. The method according to claim 8, wherein the indicator comprises an auxiliary communications device.

13. The method according to claim 12, further comprising a secondary power circuit for powering the auxiliary communications device.

14. The device according to claim 12, wherein the auxiliary communications device comprises at least one of a wi-fi device, a cellular device, a radio frequency device, a telephonic device and a Bluetooth device.

15. A safety device for a boat dock, comprising:
 an alarm device configured provide an alert to a person upon being triggered by an electrical fault of the boat dock,
 a triggering device configured to trigger the alarm device, comprising:
  a current tap electrically coupleable to an electrically conductive frame member of the boat dock;
  a grounding member configured for placement in water adjacent to the boat dock, and
  a detector configured to detect the presence of an electrical current flowing between the current tap and the grounding member, and configured to send a triggering signal to the alarm device upon detection of the current.

16. The device according to claim 15, wherein the alarm device comprises at least one of a light emitting and audio alert.

17. The device according to claim 15, wherein the alarm comprises a mounting member configured to be rigidly secured to the waterborne structure.

18. The device according to claim 15, further comprising an auxiliary communications device activatable by the triggering device.

19. The device according to claim 18, further comprising a secondary power circuit for powering the auxiliary communications device.

20. The device according to claim 12, wherein the auxiliary communications device comprises at least one of a wi-fi device, a cellular device, a radio frequency device, a telephonic device and a Bluetooth device.

* * * * *